(12) United States Patent
Renwick et al.

(10) Patent No.: US 6,943,882 B2
(45) Date of Patent: Sep. 13, 2005

(54) METHOD TO DIAGNOSE IMPERFECTIONS IN ILLUMINATOR OF A LITHOGRAPHIC TOOL

(75) Inventors: Stephen P. Renwick, San Bruno, CA (US); Steven D. Slonaker, San Mateo, CA (US)

(73) Assignee: NIKON Precision, Inc., Belmont, CA (US)

( * ) Notice: Subject to any disclaimer, the term of this patent is extended or adjusted under 35 U.S.C. 154(b) by 431 days.

(21) Appl. No.: 10/322,795

(22) Filed: Dec. 19, 2002

(65) Prior Publication Data

US 2004/0119957 A1 Jun. 24, 2004

(51) Int. Cl.$^7$ .............................. G01B 11/00; G01B 9/00
(52) U.S. Cl. ........................ 356/399; 356/124; 355/53
(58) Field of Search ................................. 356/399–400, 356/124, 124.5, 121; 355/52, 53, 55; 250/492.21; 430/4, 5, 30

(56) References Cited

U.S. PATENT DOCUMENTS

| | | | | |
|---|---|---|---|---|
| 5,631,731 A | * | 5/1997 | Sogard | ........................ 356/121 |
| 5,795,688 A | * | 8/1998 | Burdorf et al. | ................ 430/30 |
| 6,356,345 B1 | | 3/2002 | McArthur et al. | |
| 6,710,856 B2 | * | 3/2004 | Van Der Laan et al. | ...... 355/71 |
| 2002/0041377 A1 | * | 4/2002 | Hagiwara et al. | ........... 356/399 |

* cited by examiner

Primary Examiner—Layla G. Lauchman
(74) Attorney, Agent, or Firm—Greenblum & Bernstein, P.L.C.

(57) ABSTRACT

A method for diagnosing a lithographic tool. The method includes developing digitalized images of at least one wafer pattern with different exposure doses and assembling the digitized images into a pupilgram. The at least one function is of a known illuminator behavior of the lithographic tool is modeled. The pupilgram is fitted to the modeled function to determine whether a behavior associated with the pupilgram is within predetermined limits of illuminator behavior to diagnosis imperfections in the illuminator behavior. One technique applied to the illuminator analysis consists of evaluating the dose transmitted (by direct calculation) by the lens for a given input pupilgram (or set of pupilgram basis functions), a given pattern size and pitch, and a defined lens NA, is described. This transmitted dose is calculated and displayed as a function of position within the illumination distribution (pupilgram), and is valuable for the highlighting of those parts of the illumination distribution that contribute the largest amount of relative dose to the imaging process, and to compare the dose transmitted by different orientations of the same pattern.

41 Claims, 13 Drawing Sheets

METHOD TO DIAGNOSE IMPERFECTIONS IN ILLUMINATOR OF A LITHOGRAPHIC TOOL

BACKGROUND OF THE INVENTION

1. Field of the Invention

The present invention relates generally to a method used to diagnose imperfections in an illuminator of a lithographic tool, and more specifically to a method of diagnosing imperfections in an illuminator of a lithographic tool, as well as the impact of such imperfections upon imaging performance, using linear fitting of pupilgrams to basis functions and several novel analysis techniques.

2. Background Description

Continuous improvement in the performance of semiconductor lithographic printing tools, e.g., scanners and steppers, is a goal of all tool manufacturers. The list of suspects that contribute to less-than-perfect lithographic tool performance is lengthy. One of the most frequent contributors is the lens itself, closely followed by the tool's focusing system and stages. By way of example, the lens may include aberrations that cause errors including CD non-uniformity and linewidth abnormality (LWA) while tool focusing errors reduce CD performance and stage synchronization errors can reduce image contrast.

A less-frequently suspected cause of imperfect performance is the lithographic illuminator. This is most frequently mentioned in the context of providing (or failing to provide) isotropic illumination along the lighted slot of a scanner. This is because resist CD changes with dose, i.e., non-uniformity in the power delivered to the slot can be a significant contributor to CD non-uniformity. For this reason, scanner manufacturers provide mechanisms for both measuring and adjusting power uniformity.

In addition to providing uniform illumination power, though, the illuminator is also required to deliver a certain angular intensity distribution of light impinging on the reticle. It should be readily known by those of ordinary skill in the art that this angular intensity distribution is commonly referred to as the "pupil fill" of the illuminator. The illuminator needs typically to deliver several choices of pupil fill such as, for example, circular, annular, quadrupole and the like. But, in any option, clearly, the pupil fill should be uniform along the slot, and one would expect the actual pupil fill pattern to closely resemble the ideal case seen in textbooks or used in CD modeling calculations. This has received some attention in recent years, with work being published concerning quantification of condenser errors, the estimated effects of pupil fill errors, trial limits on pupil fill aberrations, and a means of measuring the pupil fill through generation of an intensity plot called a "pupilgram"

While these have all been valuable, little work has been done to determine the importance of pupil-fill errors relative to the other imperfections in a scanner, and even less has been done to assist in fixing the errors. For example, once a user has a set of pupilgrams, it may be important to know if the imperfection observed in the pupilgram is an important or simply a minor effect. Additionally, it would be beneficial to know how stable the pupil-fill performance of the scanner is during use. After all, in the normal course of events, lenses are replaced, optics are adjusted, and lasers are serviced. A system should be stable in the presence of these adjustments.

Prior art systems have described careful production of pupilgrams as a characterization of the illuminator. Prior art systems, however, do not take into account coupling to lithographic effects, do not analyze data with lithographic effects in mind, and do not analyze data with attention paid to trouble-shooting the illuminator. Accordingly, prior art systems are not capable of adjusting and maintaining illuminators in lithographic tools quickly and accurately, improving lithographic performance and system uptime.

SUMMARY OF THE INVENTION

As a precursor to the aspects of the present invention, a method of producing a pupilgram is provided. This method includes, in embodiments, exposing wafers on a lithographic tool with a reticle, sometimes called a pinhole reticle, such that a matrix of exposures with different doses is formed on the wafer. The set of different exposure doses is selected so as to provide a series of exposure doses at increasing levels to clear resist from the wafer from the center to the edges of the pupil-fill pattern formed on the wafer. The method also includes developing digitalized images of a series of pupil-fill wafer patterns with different exposure doses and assembling the digitized images into a pupilgram.

The first aspect of the present invention includes a method of diagnosing a lithographic tool. In the method of the first aspect, at least one aerial image at a wafer plane of a lithographic tool is recorded which is an accurate reproduction of an angular light intensity distribution at a reticle plane of the lithographic tool. The at least one aerial image is assembled the into a pupilgram. A simulated pupilgram is constructed describing a response or responses of lithographic features of interest to certain changes in the pupilgram, and identifying each response as a basis function. The pupilgram is fitted to the constructed response or responses to determine whether a behavior associated with the pupilgram is within predetermined limits of lithographic behavior thereby determining whether the lithographic tool with the associated pupilgram will yield lithographic performance within a predefined range. As a result, the linear fit is used as a tool to determine whether the illuminator under test is harming the lithographic process.

The second aspect of the present invention includes a method of diagnosing a lithographic tool. The method of the second aspect includes recording at least one aerial image at a wafer plane of a lithographic tool which is an accurate reproduction of an angular light intensity distribution at a reticle plane of the lithographic tool. The at least one aerial image is assembled the into a pupilgram. At least one response of another pupilgram is constructed to at least one known illuminator behavior characteristic of the lithographic tool, and identifying each response as a basis function. The pupilgram is fitted to the at least one created response to determine whether a behavior associated with the pupilgram is within predetermined limits of illuminator behavior to diagnose imperfections in the illuminator behavior. The results of such linear fit are used as a diagnostic tool to determine whether the illuminator under test has any of the defects described by the basis functions.

The third aspect of the present invention includes a method of diagnosing a lithographic tool comprising the steps of: producing an aerial image or a series of aerial images at a wafer plane of a lithographic tool which are accurate reproductions of an angular light intensity distribution at a reticle plane of the lithographic tool. The aerial image or series of aerial images are assembled into a pupilgram. Another pupilgram is constructed to at least one known illuminator behavior of the lithographic tool. The pupilgram is multiplied by a sensitivity function describing areas of the pupil fill having an important effect on a lithographic process under study. In this aspect, for calculation, the size and orientation of the line (or space) to be considered is calculated, and the wavelength of the illumination light is captured in the pupilgram.

DETAILED DESCRIPTION OF EMBODIMENTS OF THE INVENTION

Figure 1:
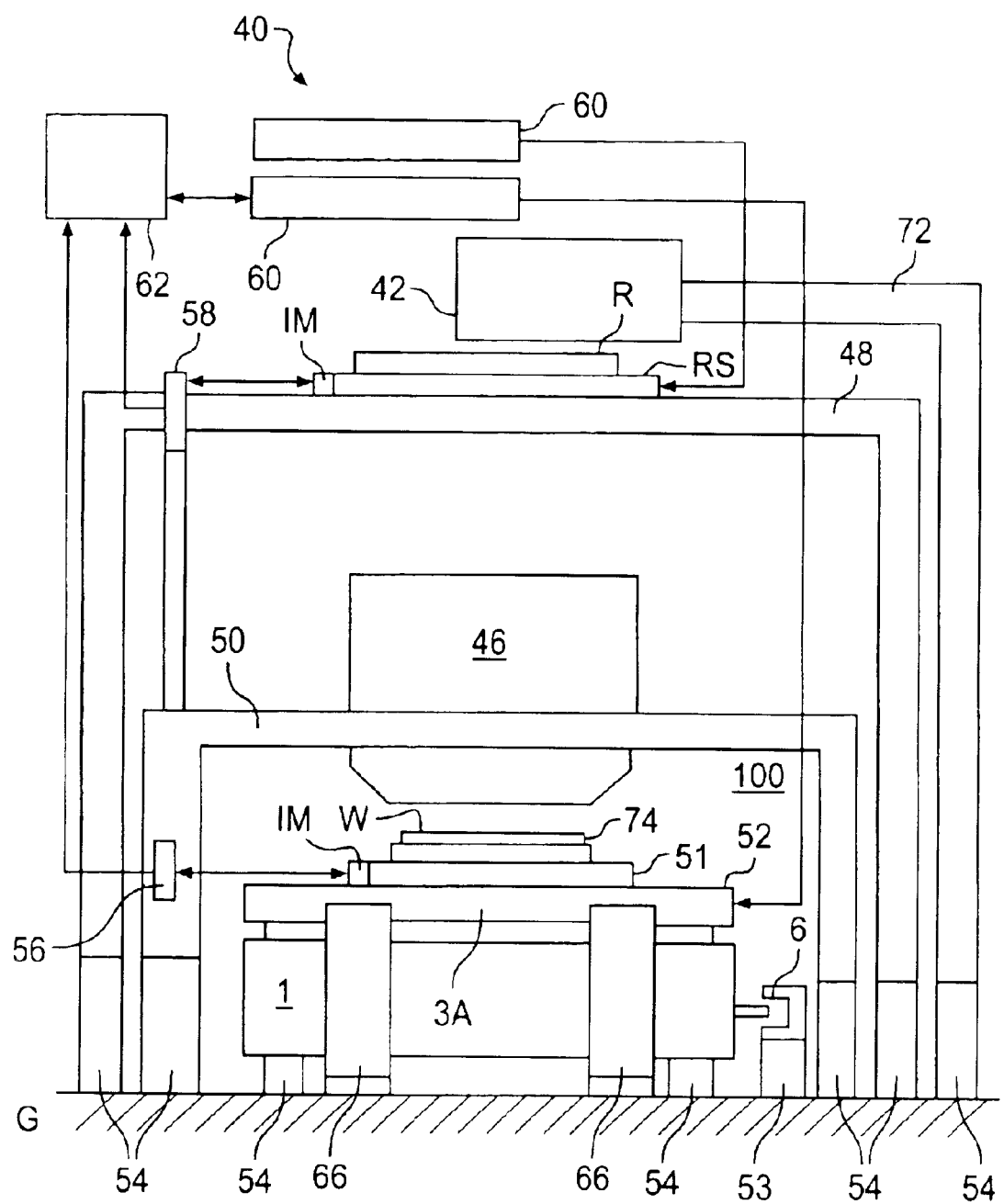
FIG. 1 is a schematic view illustrating one type of photolithography apparatus (exposure apparatus) which can be implemented with the present invention.

The present invention is directed to the diagnoses and correction of problems in a lithographic tool illuminator. By use of the present invention, it is now possible to adjust and maintain illuminators in lithographic tools more quickly and accurately, improving lithographic performance and system uptime. This is accomplished by the use of the pupilgrams, which offer a visualization of illuminator performance, in conjunction with modeled illuminator or lithographic information. The present invention quantifies pupilgram analysis by connecting it to illuminator adjustments and/or to lithography (e.g. lithographic symptoms).

In general, the present invention employs a mechanism of collecting and analyzing data describing the angular intensity distribution of light emitted by the illuminator in a lithographic tool, in which it is known that departures from ideal behavior can have important lithographic consequences. The present invention then provides several means of analyzing the data to determine their relative importance. To accomplish these advantages, the present invention takes advantage of several components, such as:

1. a "pinhole reticle" (in embodiments, the pinhole reticle includes chrome on both sides and a approximately 50-micron-diameter hole in a chrome background);
2. a procedure for making exposures on a wafer;
3. an optical microscope and digital camera for photographing the wafer;
4. analyzing the digitalized images of the wafer to construct a quantitative description of the results, commonly called a "pupilgram";
5. statistical linear fitting of the pupilgram to characteristic basis functions, or multiplying the pupilgram by a sensitivity function;
6. analysis of the lithographic effect of the basis functions or the combination of the pupilgram with the sensitivity function; and
7. analysis of the variation in transmitted dose from a specified pattern, and viewed/analyzed as a function of distribution across the illumination source, as well as a function of pattern orientation change.

As an alternative to use of the wafer, microscope, and camera, a photo-sensitive device such as a CCD array may be placed at the wafer plane. The CCD array is designed to capture the image, which is then used as a pupilgram. Also, as an alternative to the use of the pinhole reticle, a device having a pinhole may be placed at the wafer plane and a photo-sensitive device such as a CCD array may be placed below the wafer to capture an image. This image, again, may then be used as a pupilgram.

More specifically, in embodiments, by use of the pupilgrams, under normal operating conditions and with deliberate misadjustments introduced to the illuminator, it is now possible to diagnose imperfections of the illuminator by analyzing pupilgrams in one of three ways. These ways are described in detail below.

For the first analysis method, the user employs available commercial or self-developed lithographic modeling software to construct idealized pupilgrams that are known to affect the printing behavior of lithographic features of interest. Mathematical functions describing these idealized pupilgrams are used as "lithographic basis functions." For example, one might construct a pupilgram with significant "curvature," meaning that its light intensity is bright in the center and dim at the edges, or with significant "tilt," meaning that the light intensity is brighter on one side than on the other. In the former scenario, mathematical functions describing this behavior are those which describe a symmetric function with a high value in the center (x=0, y=0) and a lower value at the edge. The user employs the modeling calculations to evaluate the importance of the user's particular lithographic basis functions and determine the sensitivity of this printing to changes in the basis functions. Then, again, the pupilgram data are fit to the basis set in a linear fitting procedure. Fit coefficients are used with the predetermined lithographic sensitivity information to extract predicted lithographic effects of the pupilgram data. That is, the extracted behavior is used to select particular lithographic behaviors that would be expected from that particular pupilgram.

For the second analysis method, the user first obtains a pupilgram from a lithographic tool known to have an illuminator in good condition. Then the user induces deliberate misadjustments into the illuminator, one by one, taking a pupilgram each time. These new pupilgrams are used to construct mathematical "illuminator basis functions," each of which describes a particular misadjustment. Pupilgrams from lithographic tools under test are analyzed in terms of the illuminator basis functions in order to find the most likely misadjustment. Standard statistical techniques are used for this analysis, i.e., the basis functions are used as a basis set and the pupilgram data are fit to the basis set in a linear fitting procedure.

For the third analysis method, the user employs available commercial or self-developed lithographic modeling software, to construct a "lithographic sensitivity function" that describes areas of the pupil that are particularly sensitive to imperfections in the illuminator pupil fill described by the pupilgram, when a particular lithographic feature is printed. For example, if the user needs to print horizontal and vertical lines of the same CD, it is important that the pupilgram top and bottom have the same intensity as the sides, i.e., the sensitivity is high there, while it is not especially important if the center is dim, i.e., the sensitivity is low there. In this method, in order to avoid performing multiple calculations, a family of curves is constructed from the sensitivity function in order to describe lithographic effects of a single parameter (e.g., HV bias) at a multiplicity of feature sizes.

Alternative to the use of commercial software, the total optical energy or dose transmitted to the wafer plane may be directly calculated by combining knowledge of the distribution of diffracted light in the pupil plane of a lens with the intensity distribution of the illumination source. In particular, the variation in transmitted dose with orientation of the pattern shows itself quite readily as a driving component of H-V bias, for example.

Use of one or more of these three methods allows the placement of bounds on the relative importance of imperfections in the pupil fill and shows that adjustments to a scanner may or may not significantly alter its performance in an area of interest.

Embodiment of Photolithography Apparatus Used with the Present Invention

FIG. 1 is a schematic view illustrating one type of photolithography apparatus (exposure apparatus) which may be implemented with the present invention. It should be recognized by those of ordinary skill in the art, though, that other photolithography apparatus may also equally be used with the present invention; however, the apparatus of FIG. 1 will be discussed for purposes of this discussion, without providing any limiting features of the present invention. For example, the photolithography system may be a LCD photolithography system that exposes a liquid crystal display device pattern onto a rectangular glass plate or a photolithography system for manufacturing a thin film magnetic head.

Now referring to FIG. 1, a wafer positioning stage 52 includes a wafer stage 51, a base 1, a following stage base 3A, and an actuator 6. The wafer stage 51 comprises a wafer chuck 74 that holds a wafer W and an interferometer mirror IM. The base 1 is supported by a plurality of isolators 54. The following stage base 3A is supported by a wafer stage frame (reaction frame) 66. The actuator 6 is supported on the ground G through a reaction frame 53. The wafer positioning stage 52 is structured so that it can move the wafer stage 51 in multiple (e.g., three to six) degrees of freedom under precision control by a drive control unit 60 and system controller 62, and position the wafer W at a desired position and orientation relative to the projection optics 46. In this embodiment, the wafer stage 51 has six degrees of freedom by utilizing the Z direction forces generated by the x motor and the y motor of the wafer positioning stage 52 to control a leveling of the wafer W. However, a wafer table having three degrees of freedom ($z$, $6_x$, $6_y$) or six degrees of freedom can be attached to the wafer stage 51 to control the leveling of the wafer. The wafer table includes the wafer chuck 74, at least three voice coil motors (not shown), and bearing system.

Still referring to FIG. 1, an illumination system 42 is supported by a frame 72. The illumination system 42 projects radiant energy (e.g., light) through a mask pattern on a reticle R that is supported by and scanned using a reticle stage RS. The reaction force generated by motion of the reticle stage RS can be mechanically released to the ground through a reticle stage frame 48 and the isolator 54, in accordance with the structures described in JP Hei 8-330224 and U.S. Pat. No. 5,874,820, the entire contents of which are incorporated by reference herein. The light is focused through a projection optical system (lens assembly) 46 supported on a projection optics frame 50 and released to the ground through isolator 54.

An interferometer 56 is supported on the projection optics frame 50 and detects the position of the wafer stage 51 and outputs the information of the position of the wafer stage 51 to the system controller 62. A second interferometer 58 is supported on the projection optics frame 50 and detects the position of the reticle stage RS and outputs the information of the position to the system controller 62. The system controller 62 controls a drive control unit 60 to position the reticle R at a desired position and orientation relative to the wafer W or the projection optics 46.

In the embodiments of the present invention, the projections optics frame 50 is mounted to the ground G. Additionally, the interferometer 56 and second interferometer 58 are both mounted to ground by the optics frame 50 (in addition to the projection optics 46). Also, at least the reaction frame 53 and the wafer stage frame 66 are connected to the ground G. More specifically, the reaction frame 53, the wafer stage frame 66 as well as the wafer positioning stage 52 and the wafer stage 51 comprising the wafer chuck 74 that holds a wafer W and the interferometer mirror IM is connected to the ground G. Further, support members that can transmit the reaction forces or vibrations may be connected to the ground G. For example, the frame 72 supporting the illumination system 42 and the reticle stage frame 48 can be connected to the ground G.

As discussed earlier, there are a number of different types of photolithographic devices. For example, apparatus 40 may comprise an exposure apparatus that can be used as a scanning type photolithography system which exposes the pattern from reticle R onto wafer W with reticle R and wafer W moving synchronously. In a scanning type lithographic device, reticle R is moved perpendicular to an optical axis of projection optics 46 by reticle stage RS and wafer W is moved perpendicular to an optical axis of projection optics 46 by wafer positioning stage 52. Scanning of reticle R and wafer W occurs while reticle R and W are moving synchronously in the x direction. Alternatively, exposure apparatus 40 can be a step-and-repeat type photolithography system that exposes reticle R while reticle R and wafer W are stationary. In the step and repeat process, wafer W is in a fixed position relative to reticle R and projection optics 46 during the exposure of an individual field. Subsequently, between consecutive exposure steps, wafer W is consecutively moved by wafer positioning stage 52 perpendicular to the optical axis of projection optics 46 so that the next field of semiconductor wafer W is brought into position relative to projection optics 46 and reticle R for exposure. Following this process, the images on reticle R are sequentially exposed onto the fields of wafer W so that the next field of semiconductor wafer W is brought into position relative to projection optics 46 and reticle R. In the illumination system 42, the illumination source can be g-line (436 nm), i-line (365 nm), KrF excimer laser (248 nm), ArF excimer laser (193 nm) and $F_2$ laser (157 nm).

With respect to projection optics 46, when far ultra-violet rays such as the excimer laser is used, glass materials such as quartz and fluorite that transmit far ultra-violet rays are preferably used. When the $F_2$ type laser or x-ray is used, projection optics 46 should preferably be either catadioptric or refractive (a reticle should also preferably be a reflective type).

Also, with an exposure device that employs vacuum ultra-violet radiation (VUV) of wavelength 200 nm or less, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japanese Patent Application Disclosure No.10-20195 and its counterpart U.S. Pat. No. 5,835,275. In these cases, the reflecting optical device can be a catadioptric optical system incorporating a beam splitter and concave mirror. Japanese Patent Application Disclosure No. 8-334695 published in the Official Gazette for Laid-Open Patent Applications and its counterpart U.S. Pat. No. 5,689,377 as well as Japanese Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above-mentioned U.S. patents, as well as the Japanese patent applications published in the Office Gazette for Laid-Open Patent Applications are incorporated herein by reference.

It should thus now be recognized that the use of apparatus 40 provided herein is not limited to a photolithography system for semiconductor manufacturing. Apparatus 40 (e.g., an exposure apparatus), for example, can be used as an LCD photolithography system that exposes a liquid crystal display device pattern onto a rectangular glass plate or a photolithography system for manufacturing a thin film magnetic head.

The photolithography system according to the above-described embodiments can be built by assembling various subsystems in such a manner that prescribes mechanical accuracy, electrical accuracy and optical accuracy. In order to maintain the various accuracies, prior to and following assembly, every optical system is adjusted to achieve its optical accuracy. Similarly, every mechanical system and every electrical system are adjusted to achieve their respective mechanical and electrical accuracies.

The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that accuracy is maintained in the complete photolithography system.

Embodiment of Pinhole Reticle Used with the Present Invention

Figure 2A:
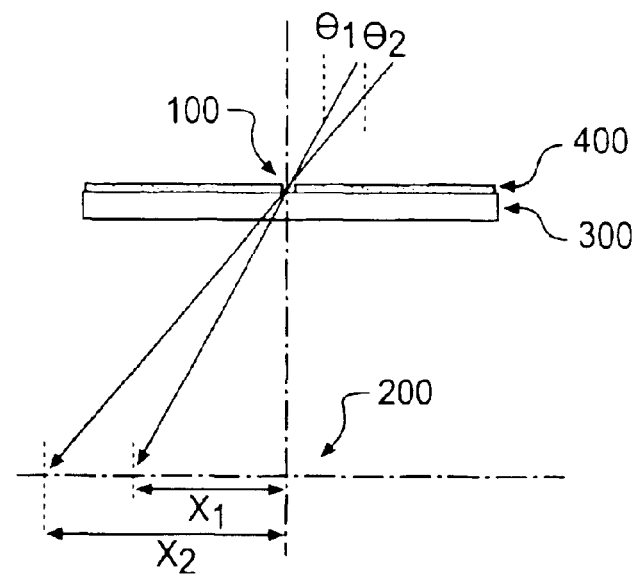
FIGS. 2a and 2b show the basic principle of two forms of a pinhole reticle.
Figure 2B:
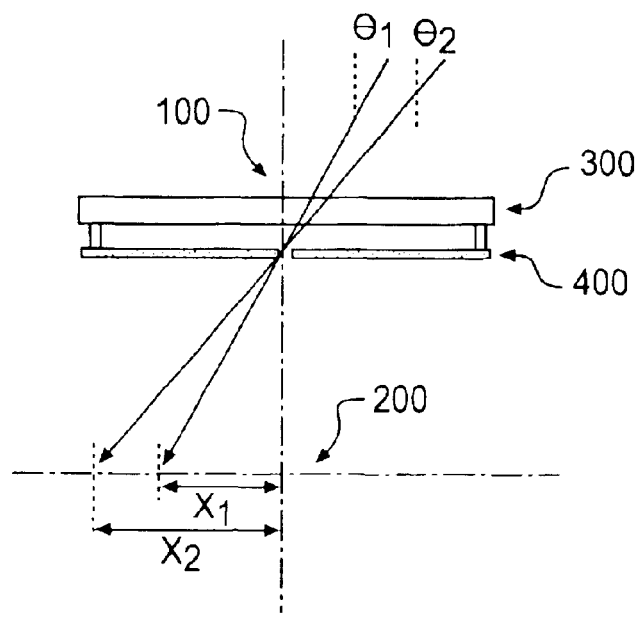

Now referring to FIGS. 2a and 2b, the basic principle of a pinhole reticle to be used with the present invention is shown. For each reticle point $x_1$ and $x_2$, a pinhole 100 allows only light from one angle to pass through and hit the image plane 200 (since in this application the lens aberrations and thus its effects are negligible, the figure is drawn as if the lens did not exist). Thus, light incident at angle $\theta_1$ strikes the wafer (image plane) only at point $x_1$, while light incident at $\theta_2$ strikes the wafer only at point $x_2$. Any angle-dependent intensity variation between angles $\theta_1$ and $\theta_2$ at the object plane 300 will be seen as a spatial variation between $x_1$ and $x_2$ at the image plane 200. It should be understood that for purposes of this invention, the lens functions solely to transfer the reticle-plane pattern to the wafer plane. For that reason, FIG. 2 is drawn as if the lens does not exist.

A single pinhole will thus project a pattern of the pupil-fill intensity, or the degree to which it approximates the angular intensity distribution intended by the illuminator designers. An array of pinholes in the illuminated field, on the other hand, will yield several patterns, allowing the user to see the pupil-fill uniformity, or the difference between the pupil fills visible at different points in the field.

The pinholes 100 may be arranged in any shape such as, for example, a circular, or rectangular array or the like and may individually be circular or square pinholes, for example. The pinholes 100, located in the pinhole plane 400, can be located either above or below the object plane 300 as shown in FIGS. 2a and 2b, respectively. In embodiments, the reticle plane is located above the object plane 300. In either scenario of FIGS. 2a and 2b, the same effect occurs. By way of example, a commercial reticle, the Litel SMI (Source Measurement Instrument), which uses a thin metal plate, with pinholes punched in it, at the pellicle plane was sometimes used for this purpose; however, it should be understood that other types of reticles such as, for example, chrome plated reticles can also be used with the implementation of the present invention and do not affect its purpose.

An alternative to the pinhole reticle is the "dot reticle" or "negative pinhole" reticle. This is substantially identical to the pinhole reticles described above and to those shown in FIGS. 2a and 2b, except that instead of a hole in a chrome background, the dot reticle employs a chrome dot in a clear background. Those skilled in the art will recognize that the principle will be the same except that a negative image will be cast. It should also be understood that the present invention is not limited to use with a pinhole or dot reticle. In other embodiments, on some particular lithographic tools, it is possible to place a pinhole at the wafer plane, with a clear reticle or no reticle at the reticle plane, and place a photo-sensitive device such as a CCD array below the wafer plane. Data are then collected from the CCD device. The use of the reticle method is provided herein as an illustrative example of common use.

Embodiment of the Printing and Photographing Method Used with the Present Invention Now, the intensity in the aerial image as a function of radius is directly proportional to intensity as a function of angle. In embodiments, when the reticle method is used, it is possible to place a CCD array or other photo-sensitive device at the wafer plane and, in so doing, capture a set of data accurately describing the intensity of the aerial image. If the reticle is not used, and the pinhole is at the wafer plane, it is similarly possible to place a CCD array or other photo-sensitive device below the wafer plane and also capture an accurate representation of the aerial image intensity.

Frequently, though, the experimenter will use wafers and photo-sensitive resist to capture the image. In this case, the exposed image is not a faithful or accurate representation of the aerial image, since, as is obvious to one skilled in the art, the resist response is nonlinear. Therefore, the method, espoused by J. P. Kirk, of using dose-to-clear contours to remove the nonlinearity is utilized herein, which teachings are now incorporated in its entirety by reference herein. (See, J. P. Kirk and C. J. Progler, "Pupil illumination: in situ measurement of partial coherence." Optical Microlithography XI, L. Van den Hove, ed., Proceedings of SPIE 3334, p. 281–288, SPIE, Santa Clara Calif. 1998.) Further, the resist response to the variation in incident angle of light may be calculated and/or characterized and compensated for, as should now be understood by those of ordinary skill in art.

More specifically, to print the wafer on the image plane two exposures are used. In the first exposure, little frames and fiducial marks are formed. In the second exposure, the pinholes are printed. To print the pinholes, a series of exposures is made, increasing the dose each time. In the first dose, the resist begins to clear in the center of the pattern and in the last dose the resist has cleared at the edges. In each exposure, then, it can be determined exactly what the dose was in the threshold region (and only in the threshold region). The dose-to-clear threshold in each exposure thus represents a single contour through the real intensity distribution. In one experiment, it was found that the exposed images are quite large, on the order of 200µ diameter, which are visible with an optical microscope.

The user will find that the effective dose at the wafer plane is reduced by the pinhole camera's diffuse image. Effective dose $D_{eff}$ related to the nominal dose $D_{nom}$ by the ratio of pinhole area to pattern area is:

$$D_{eff} = A_{pinhoe} \frac{A_{pattern} D_{nom}}{}$$

Therefore, very high doses are needed for exposure. For reasons of illustration only, doses ranging from around 1500 to 5000 mJ/cm² are discussed for the present invention. Exposures in this set were shot with a Nikon® S203 KrF scanner, with the lens NA set to 0.68 and the pupil fill set to circular illumination, with partial coherence a σ=0.40.

Incidentally, in cases where a "dot reticle" is used, doses are much smaller and very close to the nominal exposure dose for the resist process being used. In cases where CCD arrays or other photo-sensitive devices are used, dose will vary depending on the device.

Figure 3A:
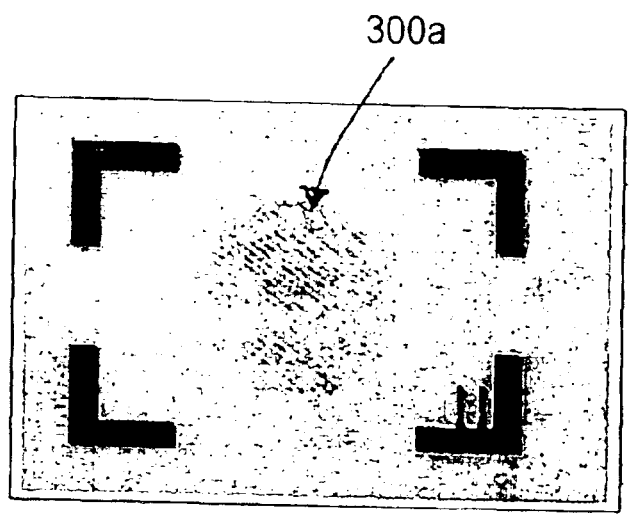
FIGS. 3a and 3b show digitalized images of wafer patterns at varying doses.
Figure 3B:
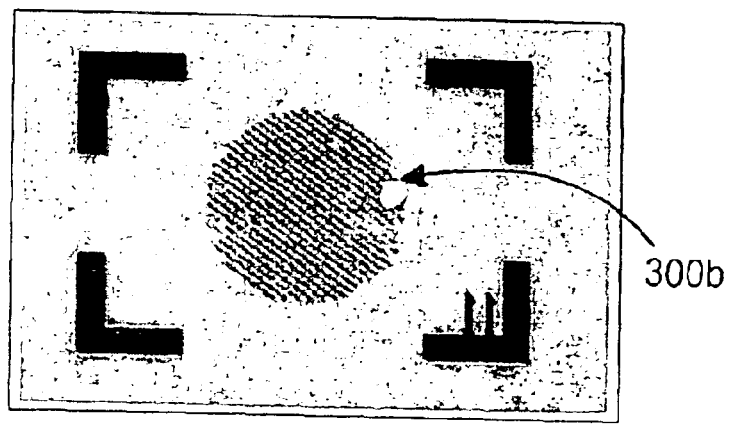

Once the exposures are complete to form the wafer, a microscope with CCD camera is then used to produce digitalized grayscale images 300a and 300b such as shown in, for example, FIGS. 3a and 3b, respectively. It should be understood that each of the digitalized grayscale images of FIGS. 3a and 3b resulted from different doses being applied through the pinholes. These images can equally be color images of the exposed wafer. The flyseye elements in one illuminator used for purposes of this experiment are clearly visible in these pictures, showing that this is indeed a diagnostic of the illuminator.

Figure 4:
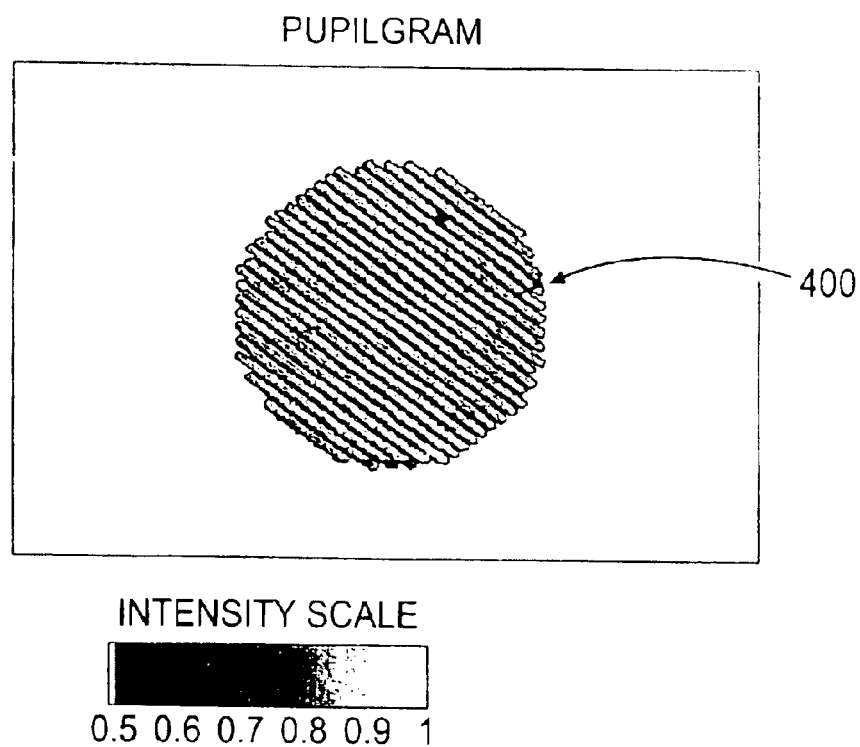
FIG. 4 shows a grayscale contour plot of a sample of a pupilgram.

Once the images are recorded they are then analyzed to produce pupilgrams 400 such as shown in FIG. 4. Each of the digitalized images are scanned and assembled to form a single pupilgram. In the example of FIG. 4, more than the digitalized images 700a and 700b, respectively, shown in FIGS. 7a and 7b, may have been used, depending on the particular application.

For each picture, the dose-to-clear threshold area is identified via grayscale level. Pixels thus identified are assigned a numerical value of the reciprocal of the dose for that picture, while others are assigned zero. Each picture thus forms a single intensity contour, and the set of contours from the set of pictures is assembled to form the single pupilgram. It should be understood that, in embodiments, the darkest spots are the dose-to-clear threshold and the white spots are where resist has been exposed, however, particular grayscale levels will depend on the resist process used and on photographic conditions. It should also be understood that the frame visible in the pictures in FIGS. 3a and 3b is necessary for alignment of successive pictures, but is not itself part of the pupilgram. It should be clear, then, that several pictures are necessary to form one pupilgram, and that exposures used to print the wafer should be around the dose-to-clear threshold in the pinhole image region.

Additional work may then be performed to improve pupilgram readability. For instance, when used with illuminators that have flyseyes, this may be performed by dithering the individual flyseye elements to merge them together (i.e., an adjustable "blob factor"). This makes the picture smoother but also introduces a blocky quality as a processing artifact. This may tend to magnify irregularities near the edge of the pupilgram. Partially due to these processing artifacts, most of the quantitative information was extracted not from raw pupilgrams but rather from fits of basis functions to them, as discussed below.

Referring still to FIG. 4, it should be noted that the gray scale on the pupilgram was selected such that the black part corresponds to intensity 0.60, i.e., the pupilgram deliberately emphasizes variation at the top. As can be seen, the intensity profile is "hot" in the center and tapers more or less smoothly to the edges (as can be seen from the bright center portion and the less intense edges). Irregularity in the perimeter is seen, some of which is due to the processing and some of which is real. The peak intensity is slightly offset from the center of the pupil. This sample pupilgram was taken at large partial coherence, from a 0.60-NA KrF scanner. The scale indicates intensity, normalized to the peak value.

Figure 12A:
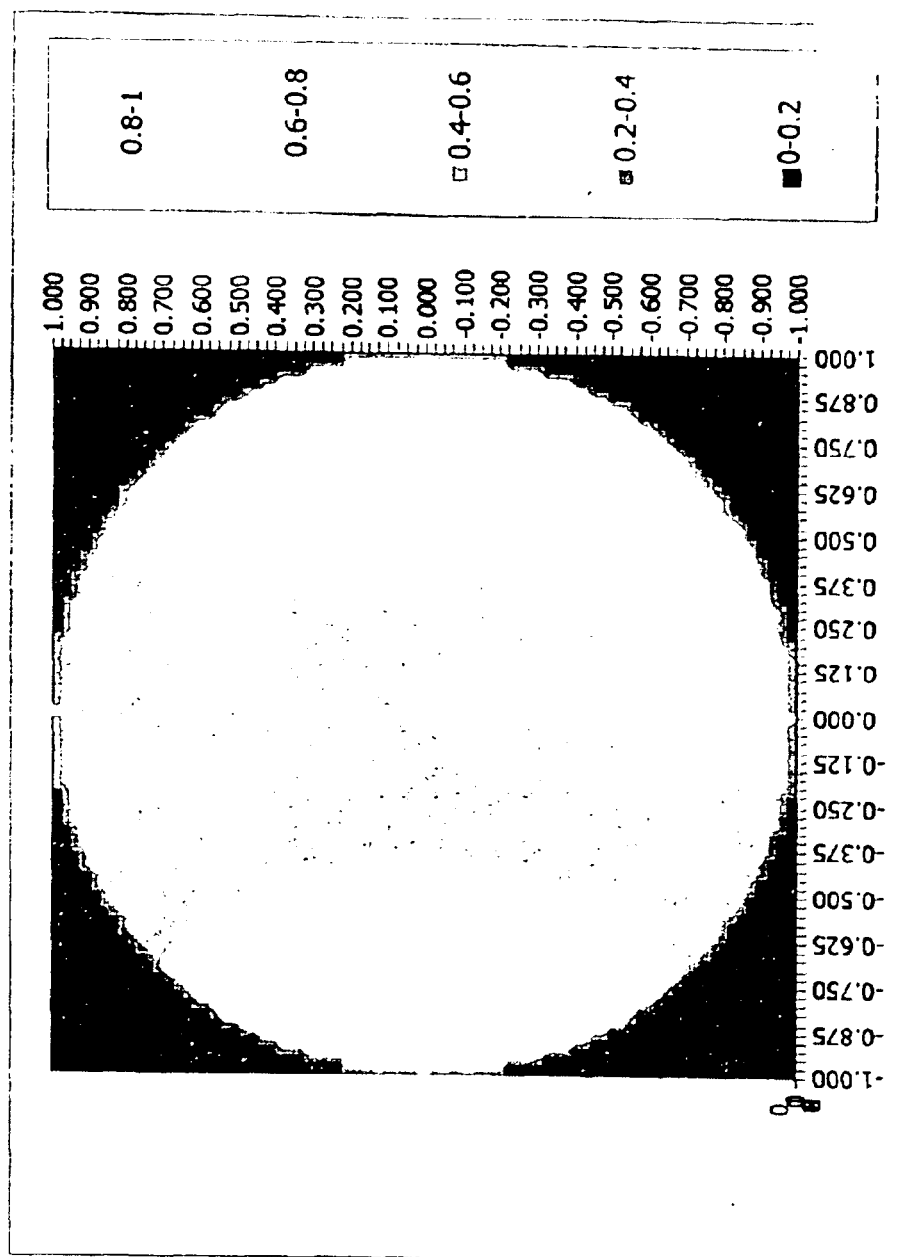
FIGS. 12a, 12b, and 12c shows the transmitted dose contours for vertical lines, horizontal lines, and the difference between the two, for a particular illumination/projection lens configuration and reticle pattern.
Figure 12B:
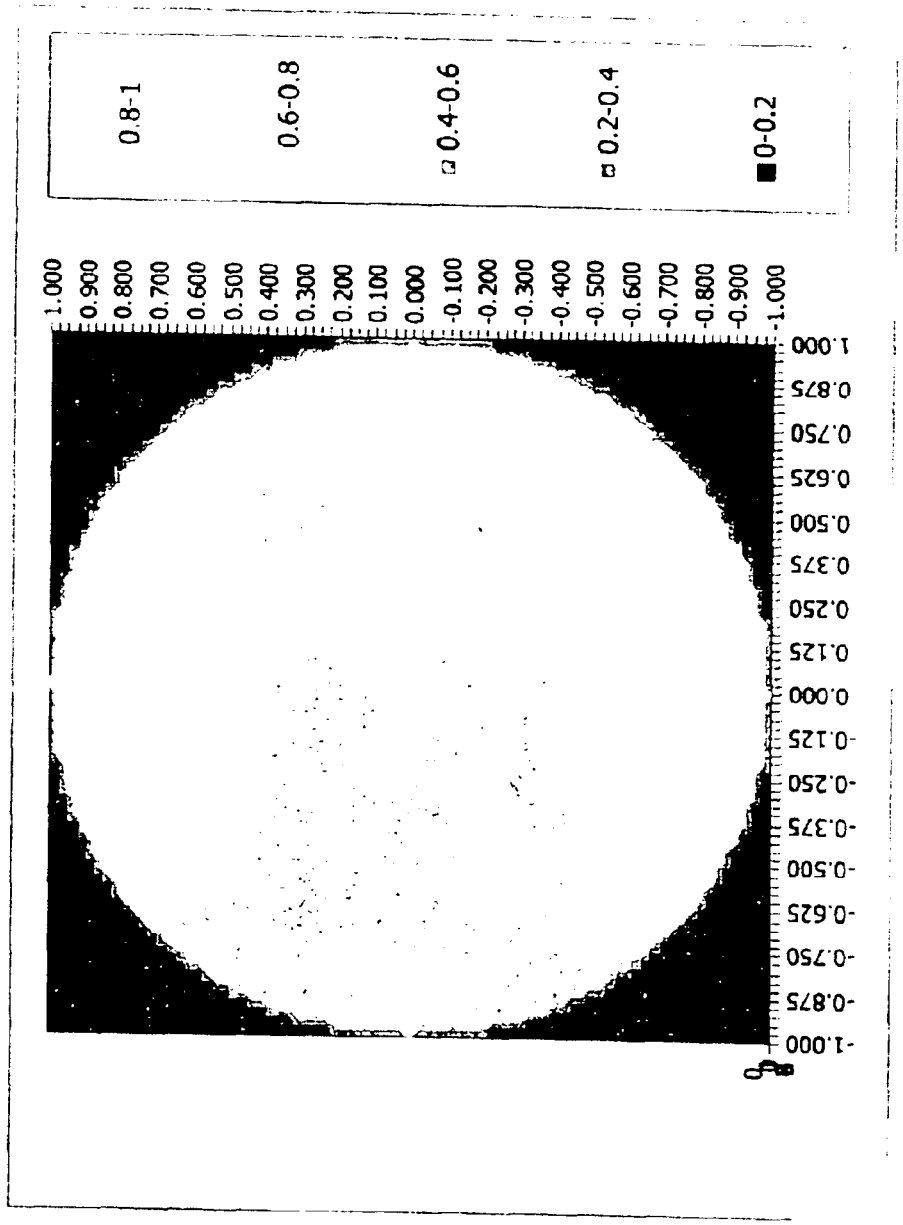
Figure 12C:
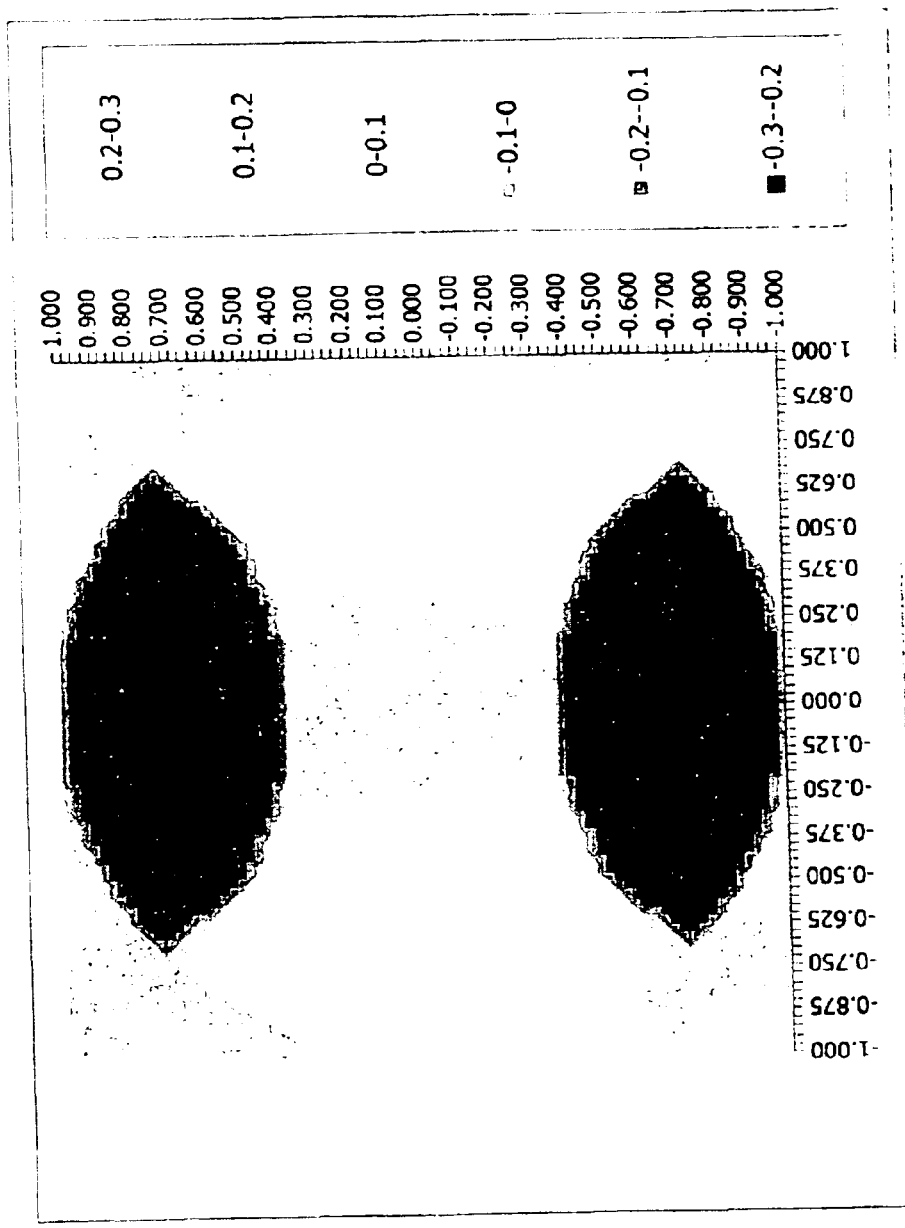

FIGS. 12a, 12b, and 12c show an example of analysis of the difference between the amount of light transmitted by the lens for a vertical 150 nm line on a 300 nm pitch and the conditions of FIG. 8 (NA=0.60, wavelength=248.385 nm), and a horizontal line/space pattern of the same dimension. The gray levels in FIG. 12c correspond to the differences in the dose received between these two pattern orientations. The dark areas correspond to large differences in transmitted dose for vertical versus horizontal images, while the lighter regions correspond to low values of such "delta dose" between vertical and horizontal lines for the pattern simulated. Such a plot can be further used to calculate the total delta dose between various orientations, integrated over the entire figure shown, as well as highlight the regions within the illuminator distribution which are the largest contributors to such a difference.

Measurement Quality

Performing measurements is only useful if the proper measurement tools are used to perform such measurements. A simple test was used to perform such evaluation that consisted of a repeated measurement on the same tool with the same partial coherence settings. Exposures were also performed using knowledge of the details of the illuminator to inspect for improper differences in intensity distribution from one setting to the next.

These tests showed that:

1. Measurement of partial coherence simply by measuring the diameter of the exposed circle is accurate to ±0.05.
2. In order for the user to compare intensity measurements from one point in the slot to another, a reticle must be carefully constructed to ensure that the pinholes are all the same size.
3. If peak intensity values are normalized to each other, the intensity profile in repeated measurements is repeatable to about ±5%.

It was shown through these tests that the measurements were adequate for purposes of verifying the results obtained from the present invention.

Figure 5A:
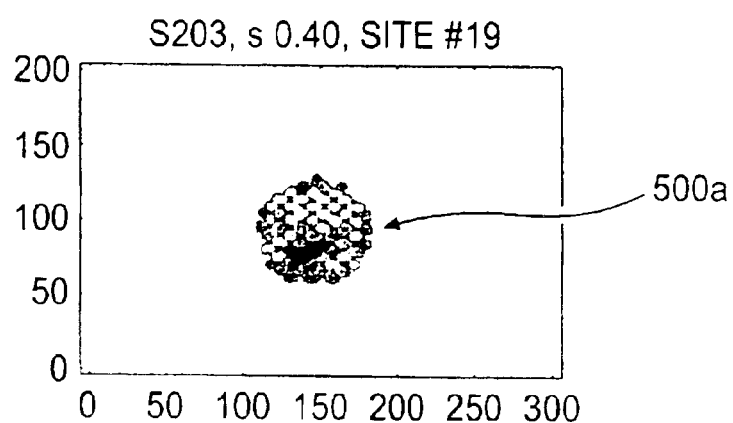
FIGS. 5a–5c show a sample of three pupilgrams from various sites along a wafer plane.
Figure 5B:
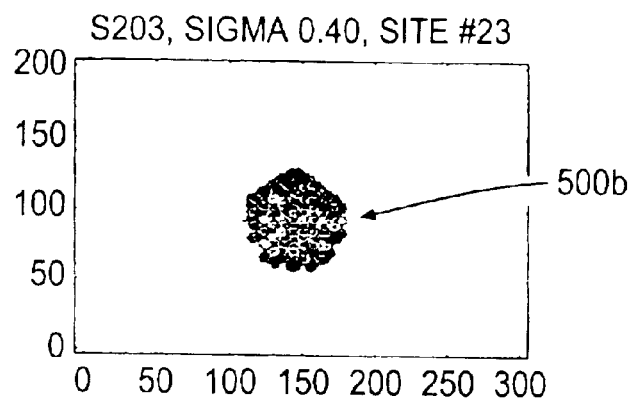
Figure 5C:
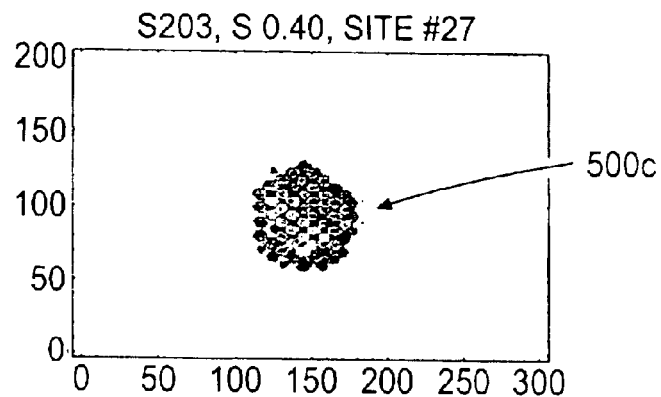

Use of Method of The Present Invention: First and Second Aspects, Lithographic and Illuminator Basis Functions In order to illustrate use of the first and second aspects of the present invention, a sample pupilgram data is employed from a real lithographic scanner. A sample of three pupilgrams shown from different points in a slot of a known scanner is shown in FIGS. 5a–5c. More specifically, FIGS. 5a–5c respectively show three pupilgrams 500a, 500b and 500c, respectively, from the left side, the center, and the right side of the scanner's illuminated slot. Individual flyseye elements are clearly visible. Again, it is noted that these pupilgrams were assembled from digitalized grayscale images of the pinholes at different exposure levels as taught in FIGS. 3a and 3b, for example.

Comparing FIGS. 5b and 5c, it is clear that the pupilgrams tend to be more intense in the center with some drop-off toward the edge. Minor variation is seen from one point to the next. FIG. 5a is distinct from the remaining sites shown, and its pupilgram 500a indicates a possible defect in this particular illuminator. This particular tool then is an extremely instructive case for analyzing pupil effects. These pupilgrams will be used for illustration of both the first aspect and the second aspect of this invention.

Misalignment of Laser Beam To Demonstrate the First and Second Aspects of The Present Invention Now that a good baseline performance of the tool has been established, it is in embodiments necessary to calculate whether the imperfections seen are important. To do this, in one embodiment, a deliberate misadjustment is introduced into the optics in order to see the effect. A misadjustment was emulated which could conceivably occur during initial laser installation or during periodic maintenance, such as laser chamber replacement: the pointing of the laser beam was deliberately set away from its nominal value. To do this, a wedge optic may be inserted into the excimer laser path such that the beam is deflected by 2.5 mrad, an angle significant when compared with normal installation and adjustment tolerances.

Effects of this misadjustment are not especially large but are readily visible. Rotating the wedge optic, thus sweeping the incident beam about in a narrow cone, changes illumination power by −15% to +6%. Power uniformity varied by 0.3% to ±0.1%. When the wedge is removed, power and uniformity readings return to their previous values with negligible error. Maximum beam power and best uniformity does not occur at the same wedge rotation angle.

One might expect that the worst power/uniformity combination should have been picked and the pupil fill re-measured. This, however, would not be especially useful since one of skill in the art would not adjust a tool in such a manner. Rather, since the goal is to search for unsuspected degradation in pupil-fill performance while adjusting the illuminator/laser combination, it was necessary to pick a wedge-optic setting that improved power and did not change uniformity.

Figure 6A:
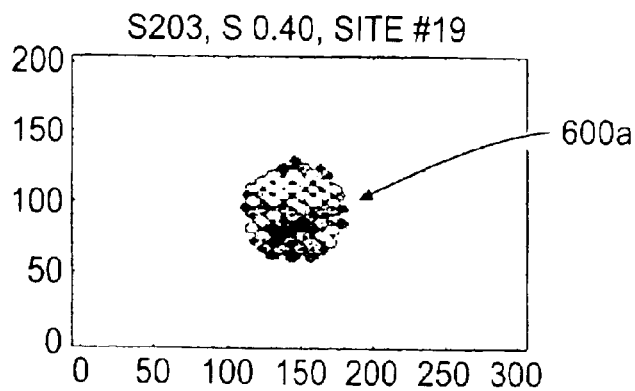
FIGS. 6a–6c show pupilgrams from a substantially same location as shown in FIGS. 5a–5c with the laser beam shifted.
Figure 6B:
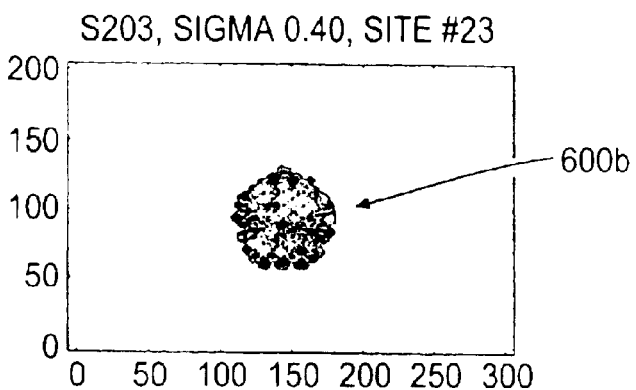
Figure 6C:
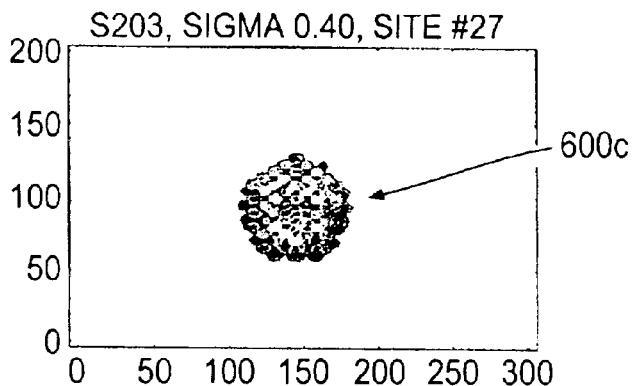

Accordingly, a wafer exposed with the pinhole reticle using the same illumination settings as shown in FIGS. 6a–6c was chosen. FIGS. 6a–6c show pupilgrams 600a, 600b and 600c, respectively, at a left side, center and right side of the wafer plane with the laser beam shifted. Qualitative changes in the pupilgram are definitely visible, and generally, intensity seems to have shifted toward the +y direction.

Experimental Analysis Method of the Present Invention: First Aspect, Lithographic Basis Functions Now suppose that the experimenter had the pupilgram data from FIGS. 5a through 5c available, as well as the pupilgram data from FIGS. 6a through 6c. Thus, the user knows that something happened to the illuminator, but does not know whether any changes in the observed lithographic performance are due to that change.

By employing the first aspect of the present invention, the user is armed with knowledge of lithographic behavior, in that there are available lithographic basis functions, functions that describe pupilgram behavior important to a lithographic process. Ideally the user would have these functions already available; however, to illustrate the procedure, the method of selecting important functions is shown.

Inspection of the pupilgrams that are shown in the accompanying figures reveals certain key features. First, the pupilgrams tend to be more intense in the center. Some, especially at the left-side site, show a distinct tilt or asymmetry in x or y. Second, basis functions should at a minimum account for the following qualitative features:

Intensity maxima or minima ("dome" or "dish").

Asymmetry in the intensity and geometric angular extent in the x or y directions.

Location of the peak intensity away from the geometric center of the pupilgram.

Polynomial basis functions in x and y can reproduce these qualities. Defining the point (x=0, y=0) as the geometric center of the pupilgram, data were fit, using a linear least-squares fit, to the function $$f(x,y)=a_1x^2+a_2y^2+a_3y^2+a_4x+a_5y+a_6$$

The extent of x and y can be independently determined or added to the fit. As a criterion of goodness of fit, the reduced $\chi^2$ parameter was used, which compares deviation from fit to experimental error (see, for example, Bevington, Philip R., *Data Reduction and Error Analysis for the Physical Sciences*, McGraw-Hill, New York, 1969). An ideal fit has $\chi^2=1$. This parameter was rather variable, ranging from about 0.5 to 13, indicating that this choice of fitting function captures the features in the data reasonably well. However, inclusion of higher-order terms did not improve the goodness of fit as described by $\chi^2$. The power center, defined as the expectation value of the pupilgram in x and y, generally was only insignificantly different from the geometric center.

The fit returns six fit coefficients, which have little intuitive physical meaning. However, one can see that the quadratic terms describe center-to-edge intensity drop in the pupilgrams, while the linear terms describe an intensity change from left to right and top to bottom. The first phenomenon is referred to as curvature while the second is referred to as tilt. Thus, with some additional calculation, all our pupilgrams are described in terms of curvature and tilt in the x and y directions. These parameters range between 0 and 1, such that:

curvature (x or y) is the fractional drop from peak to edge of the pupilgram, i.e. 20% curvature means that intensity at the edge is 0.8× the peak intensity;

tilt (x or y) similarly describes drop in intensity from one side to another.

Figure 7A:
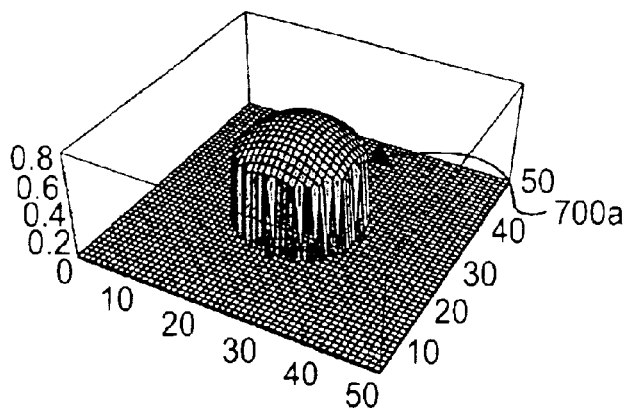
FIGS. 7a and 7b show samples of idealized pupil-fills (lithographic basis functions) with 0.30 curvature and tilt, respectively.
Figure 7B:
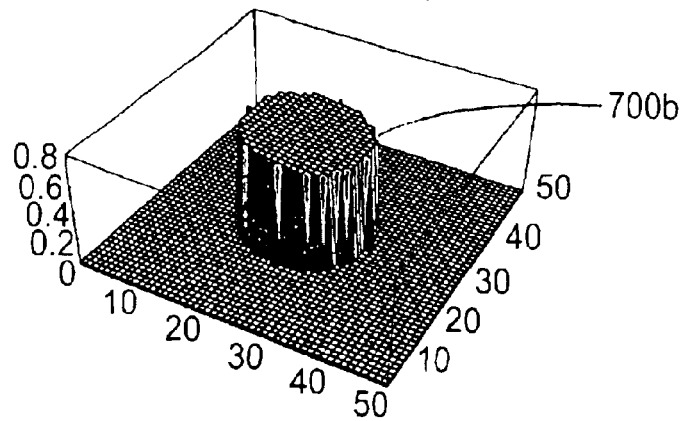

Samples of idealized pupil fills with 0.30 curvature and tilt, respectively, are shown in FIGS. 7a and 7b. It should be realized that the curvature and tilt parameters are only illustrative examples of the use of the first aspect of the present invention, and that the present invention is not limited to such parameters.

Figure 8A:
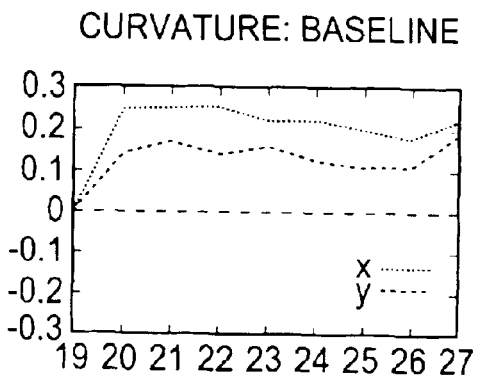
FIGS. 8a–8d show summarized results of pupilgram analysis in terms of basis functions.
Figure 8B:
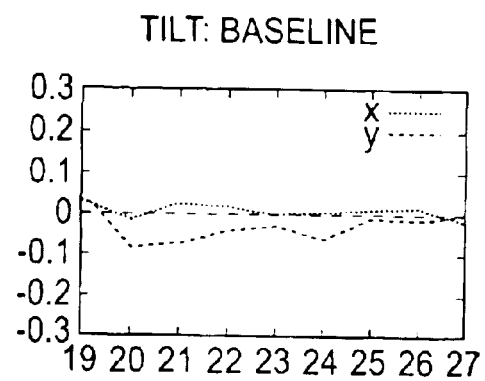
Figure 8C:
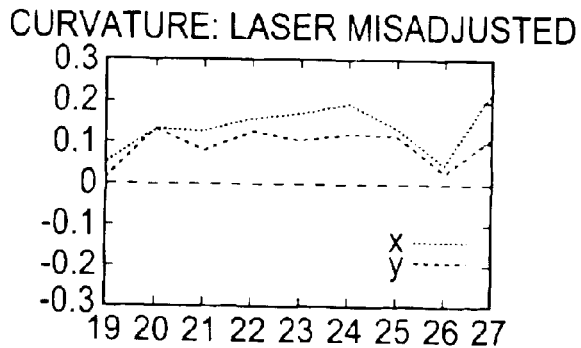
Figure 8D:
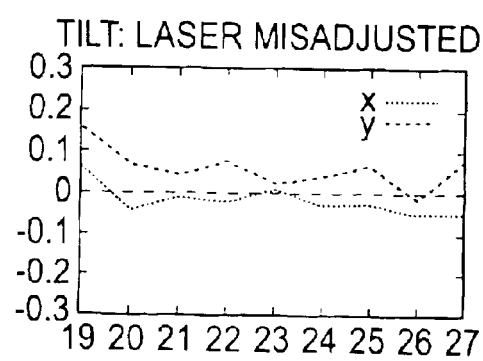

FIGS. 8a–8d show summarized results of pupilgram analysis in terms of these parameters. More specifically, in FIGS. 8a–8d, curvature and tilt parameters are plotted as a function of slot position for wafers exposed at baseline setting and with the beam misadjustment introduced. Both parameters tend to be constant along the slot. It is thus expected, then, that this behavior induces an overall shift in some lithographic parameter relative to another tool, and that one should therefore expect effects to show themselves in lithographic parameters such as CD uniformity and LWA uniformity along the slot. One might also expect an HV bias effect from differing x and y behavior. FIGS. 8c and 8d also show that the pupilgrams change when the incident laser beam is deflected. Overall curvature has actually lessened, but the variation in curvature along the slot has increased. One might expect this to affect CD uniformity. However, performance as measured by tilt of the pupilgram actually seems to have improved.

Now that the pupilgram performance is quantified, aerial image calculations are performed using a modeling program such as, for example, the commercial product Prolith™ (i.e., a simulation tool to simulate or "create" results of optical lithography processes) (Prolith is a registered trademark of KLA-Tencor). This simulation allows the user not only to select an illumination pattern (standard, annular, quadrupole) but also to employ user-generated files describing custom pupil fills; that is, the modeling program allows the user to try various 'source files', generated using different basis functions, in order to determine their importance.

In order to spot trends occurring in the lithography as pupilgrams change, then, a series of idealized pupil fills based on curvature and tilt parameters is used based on the modeling. Aerial-image calculations may then be run, for example, for 150-nm isolated lines and 180-nm grouped lines exposed with 248-mn light, with a NA of 0.68, separately with idealized pupil fills with curvatures of 0.10, 0.20, 0.30, and 0.40 and with tilts of 0.10, 0.20, 0.30, and 0.40. The idealized functions used have integrated intensity normalized in order that each modeling run had the same dose. In order to check for dependence on partial coherence, calculations were run with partial coherence (a) values of 0.4 and 0.7.

Parameters analyzed from the aerial-image output included CD (i.e., critical dimensions which are features that one is printing with the reticle; imperfections of reticle lens makes them non-uniform) through focus for both isolated and grouped lines as well as linewidth abnormality (LWA) for a 5-line group. In all cases, CD was determined by finding an aerial-image threshold value that yielded the nominal line size at best focus. In this fashion it is possible to assess the pupil-fill effects on CD uniformity, HV bias HV bias (difference between width of horizontal and vertical light), and LWA. The results showed:

Isolated-line CD through focus was sensitive to curvature.
Grouped-line LWA was sensitive to tilt, but only through focus; LWA at best focus was unchanged.
These were the only sensitivities found.

Figure 9:
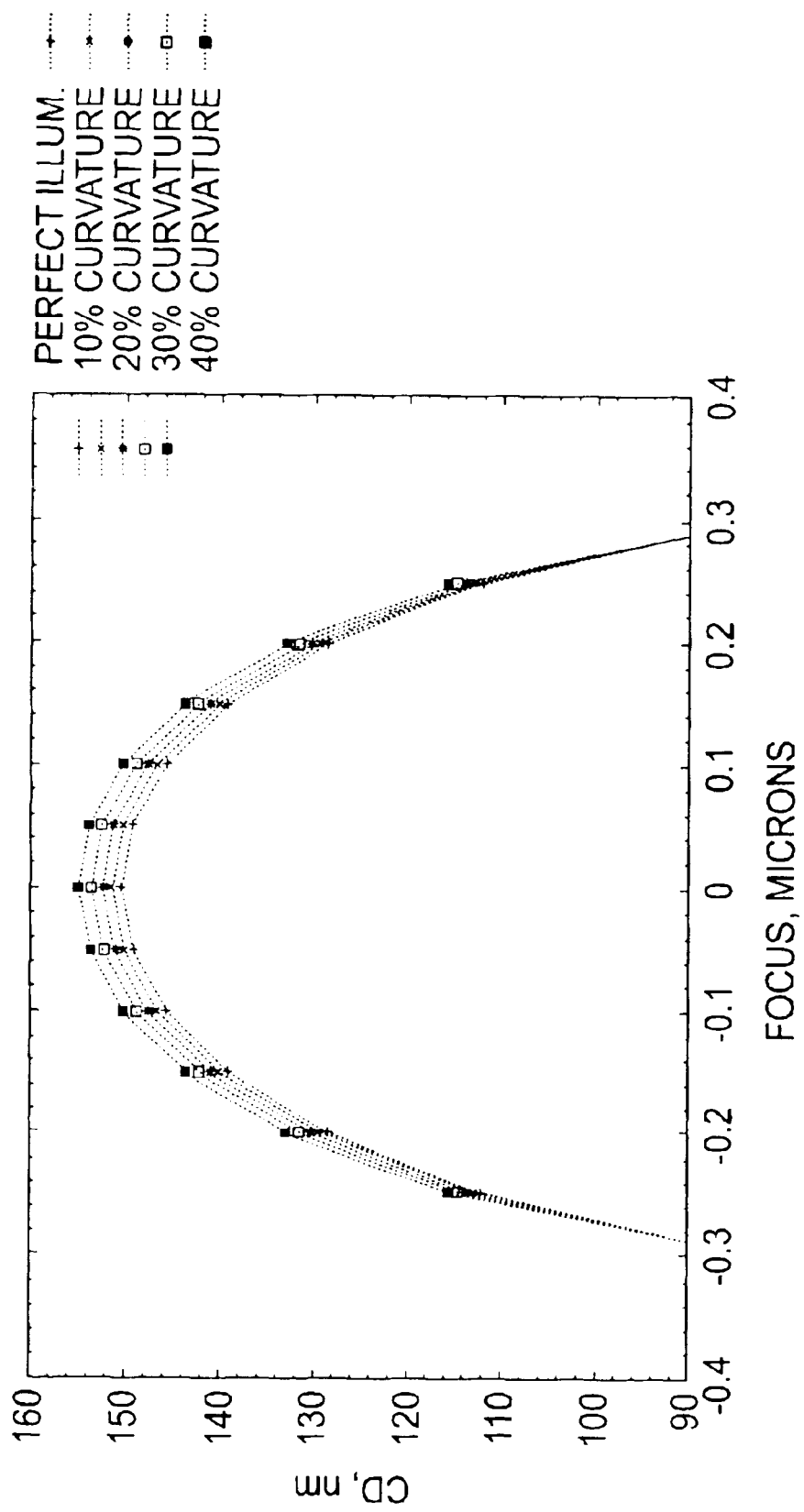
FIG. 9 shows sensitivity of isolated line CD through focus to changes in the pupil-fill curvature basis function.
Figure 10:
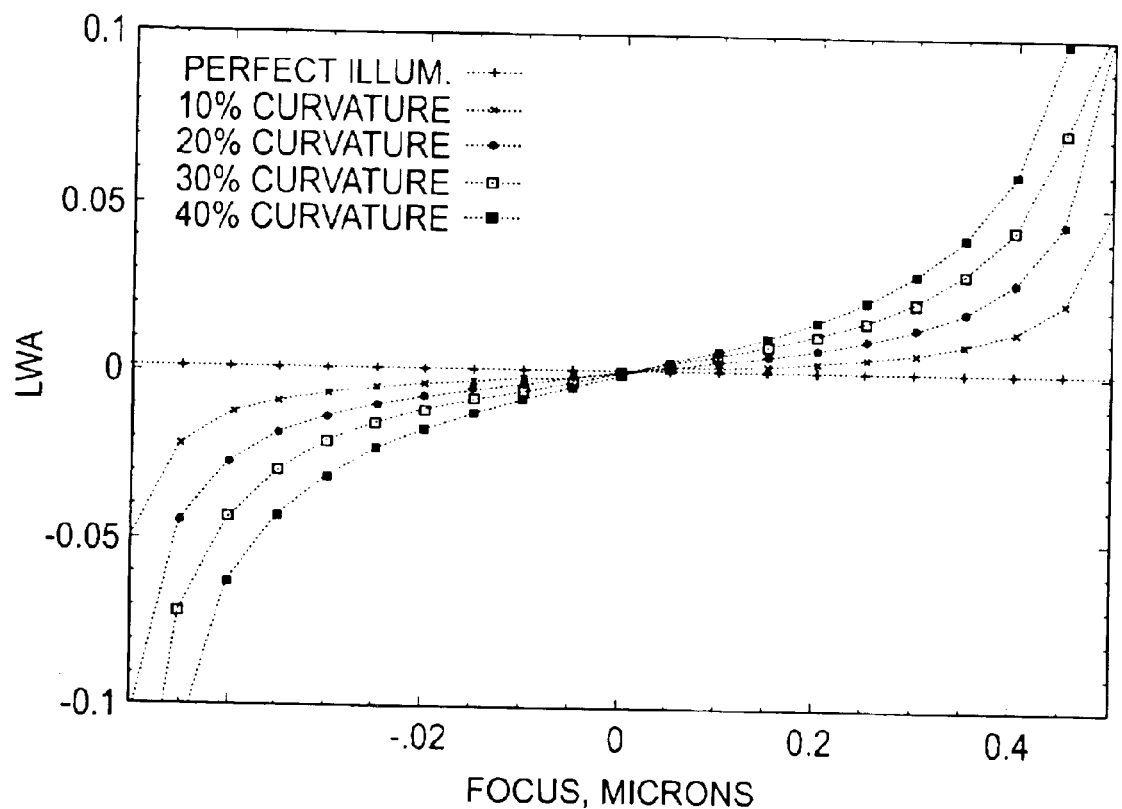
FIG. 10 shows response of linewidth abnormality (LWA) to changes in the pupil-fill tilt basis function.

The effects seen were much larger at σ=0.7 than at σ=0.4. The results of the analysis are shown graphically in FIGS. 9 and 10. More specifically, FIG. 9 shows sensitivity of isolated line CD through focus to changes in pupil-fill curvature. As shown in the legend, a perfect illumination is shown as well as curvatures of 10%, 20%, 30% and 40%. FIG. 10 shows response to linewidth abnormality to changes in pupil-fill tilt. As shown in the legend of FIG. 10, a perfect illumination was used as well as a tilt of 10%, 20%, 30% and 40%.

From these results, it is possible to obtain sensitivity parameters ΔCD/Δcurvature and ΔLWA/Δtilt, shown in Table 1. Note that the CD uniformity effect on isolated lines is strongest at best focus.

TABLE 1

Parameters for lithographic sensitivity to pupil fill imperfections, found by aerial-image modeling

|  | ΔCD/Δcurvature, @ best focus | ΔLWA/Δtilt, @ 0.3μ defocus |
| --- | --- | --- |
| σ = 0.40. | 2 nm per 10% curv. | 0.002 per 10% tilt |
| σ = 0.7 | 1.2 nm per 10% curv. | 0.010 per 10% tilt |

While neither of these effects is particularly sensitive, the results do show that one can observe both CD uniformity and coma-like LWA effects that have nothing to do with the lens.

Now understanding the above, it is possible to connect the pupilgram data to the sensitivity calculation and estimate the effects on lithography. Said otherwise, the extracted sensitivity parameters from the modeled responses are used to determine the effect the illuminator may have on the lithographic printing. To accomplish this, the pupilgram data is made to fit the modeled basis functions to quantify the illuminators deviation from perfect pupil fill behavior.

Tables 2 and 3 show the effects of curvature in the pupil fill and table 3 shows the effects of tilt on the pupil fill. Since the effects at σ=0.4 are so small, estimated effects at σ=0.7 are included, even though the test exposures were shot at σ=0.4.

TABLE 2

| Condition | Curvature slot TIR | CD TIR, σ = 0.4 | CD TIR, σ = 0.7 |
| --- | --- | --- | --- |
| Baseline, exclude site #19 | 0.05 | 0.1 nm | 0.6 nm |
| Baseline, include site #19 | 0.20 | 0.4 | 2.4 |
| Beam misadjusted, exclude site #19 | 0.12 | 0.2 | 1.4 |
| Beam misadjusted, include site #19 | 0.12 | 0.2 | 1.4 |

TABLE 3

| Condition | Max. curvature x − y difference | HV bias, σ = 0.4 | HV bias, σ = 0.7 |
| --- | --- | --- | --- |
| Baseline | 0.11 | 0.2 nm | 1.3 nm |
| Beam deflected | 0.08 | 0.2 | 0.9 |

TABLE 4

|  | Tilt variation TIR | LWA, σ = 0.4, @ 0.3μ defocus | LWA, σ = 0.7, @ 0.3μ defocus |
| --- | --- | --- | --- |
| Baseline, exclude site #19 | 0.07 | 0.001 | 0.007 |
| Baseline, include site #19 | 0.15 | 0.003 | 0.014 |

TABLE 4-continued

|  | Tilt variation TIR | LWA, σ = 0.4, @ 0.3μ defocus | LWA, σ = 0.7, @ 0.3μ defocus |
|---|---|---|---|
| Beam misadjusted, exclude site #19 | 0.07 | 0.001 | 0.007 |
| Beam misadjusted, include site #19 | 0.15 | 0.003 | 0.014 |

For CD uniformity, it is immediately seen that the illuminator can be expected to contribute a rather small effect. The largest effect is just over 2 nm with the anomalous point included. Under normal conditions, this effect is between 1 and 2 nm. When considered in the light of other known contributors to CD slot error such as, for example, imperfections in lens and scanning stages in lithographic tool, this is not an especially large contributor and is certainly not a driver.

Effects on LWA are practically within the noise level of LWA measurements. Recalling that LWA is defined as $$LWA = \frac{L_1 - L_5}{L_1 + L_5};$$

an error of only ±2 nm in measurement of linewidth would induce a ±0.010 error in LWA, swamping most of the LWA effect seen here.

Thus, moving the laser beam altered the signature of the illuminator effect. Actually the raw numbers indicate the CDU and LWA would improve as a result of this move, but this is mostly because the imperfection at the left side did not stand out as much from the rest of the slot. Other than that, it can be seen that the effect of moving the laser beam is measurable in the pupilgram but would have a small to negligible impact on CDU and LWA.

Thus, the usefulness of the first aspect of the present invention has been demonstrated. The user with the pupilgrams shown in FIGS. 5a through 5c and 6a through 6c can now determine that this particular illuminator misadjustment would have only a small effect on the printing of isolated lines of the size shown in the example, and would know that in this case he or she would not have to correct the misadjustment.

Experimental Analysis Method of the Present Invention: Second Aspect, Illuminator Basis Functions Now suppose that the experimenter had the pupilgram data from FIGS. 6a through 6c available, and further suppose that the lithographic process in question were more sensitive to the imperfections than in the example in the previous section. Thus, the user knows that there is a misadjustment in the illuminator, but does not know what it is.

Figure 11A:
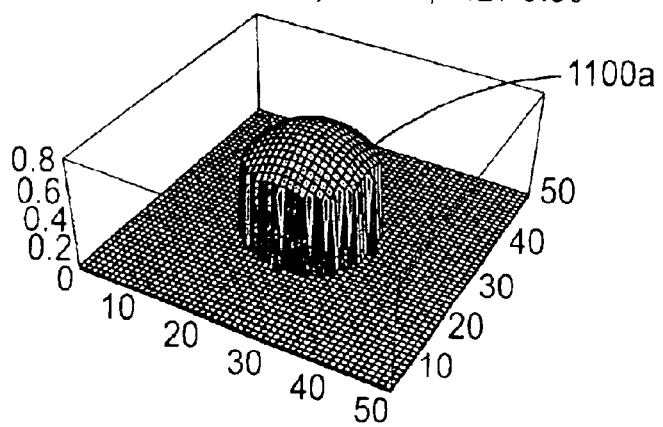
FIGS. 11a and 11b show sample basis functions.
Figure 11B:
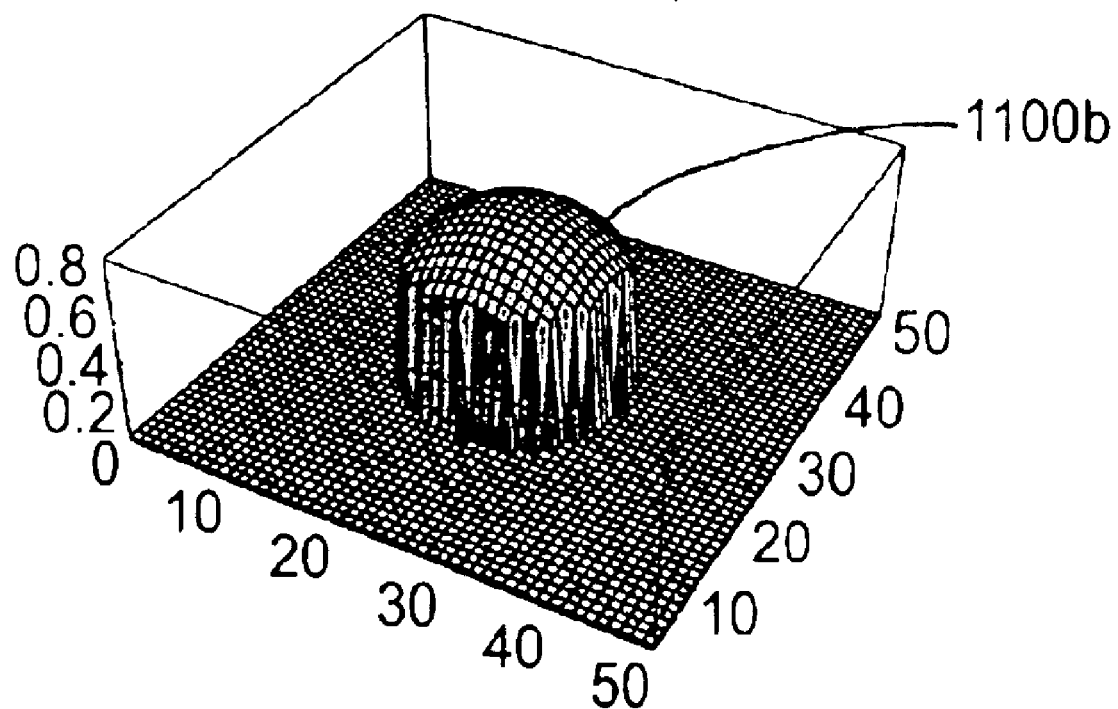

By employing the second aspect of the present invention, the user is armed with knowledge of illuminator behavior, in that the user has previously been supplied with illuminator basis functions, functions that describe pupilgram behavior induced by particular misadjustments. Sample basis functions are shown in FIGS. 11a and 11b. The basis function in FIG. 11a, by way of example, describes a pupilgram induced by laser misadjustment in the manner described in the previous section 1100a and 1100b, respectively. The basis function in FIG. 11b describes a pupilgram with the laser misaligned in a different direction.

The basis function 1100a in FIG. 11a was constructed by selecting a mathematical function that closely approximated an experimental pupilgram with the laser beam shifted in the vertical direction, and the basis function 1100b in FIG. 11b was constructed from the same function with the beam shifted in the horizontal direction. By way of example, these functions are denoted $B_x(x,y)$ and $B_y(x,y)$. In embodiments, these functions are specific to the particular illuminator and adjustment employed. The user constructs a number of basis functions large enough to describe the illuminator behavior while small enough to allow proper statistical fitting.

Now understanding the above, it is possible to connect the pupilgram data to the illuminator behavior and trouble-shoot the illuminator. To accomplish this, the pupilgram data is made to fit the modeled basis functions to quantify the illuminators deviation from perfect pupil fill behavior by means of the following equation:

$$f(x,y) = a_1 B_x(x,y) + a_2 B_y(x,y) + a_3$$

The results from this fit are shown in Table 5. In table 5, it is seen that the fit coefficient for the first basis function is much larger than that for the second basis function, which tells the experimenter that the illuminator needs to be readjusted in a manner consistent with the first basis function. In embodiments, multiple basis functions are used and multiple adjustments are discerned from the fit coefficient results.

TABLE 5

Fit coefficients from sample illuminator basis function fit

| Coefficient | Value |
|---|---|
| $a_1$ | 0.89 |
| $a_2$ | 0.065 |
| $a_3$ | −0.0006 |

Thus, the usefulness of the second aspect of the present invention has been demonstrated. The user with the pupilgrams shown in FIGS. 11a and 11b and with pre-determined illuminator basis functions would be able to determine that this particular illuminator would require an adjustment to the laser.

Experimental Analysis Method of the Present Invention: Third Aspect, Lithographic Sensitivity Functions The third aspect of the invention includes overlapping of a measured pupilgram with a "lithographic sensitivity function." The lithographic sensitivity function describes areas of the pupil fill that are more or less sensitive, i.e. more or less important, to printing of a particular lithographic feature (e.g. isolated lines of a certain CD). For example, it is known that printing of isolated lines of a certain CD is very sensitive to pupil fill imperfections at the edges of the pupilgram, especially at the 0°, 90°, 180°, and 270° positions, but relatively insensitive to imperfections in the center of the pupilgram or at the edge at the 45° position. The pupilgram is multiplied, point-by-point, with the lithographic sensitivity function, and the results are used to determine whether particular lithographic behavior of the tool is likely to be due to the pupil fill in the illuminator.

A further lithographic sensitivity function included in this aspect of the invention is the direct calculation of transmitted optical energy or dose, from a given illuminator distribution through a given lens NA for a particular reticle pattern. This function can be calculated directly from either the pupilgram data itself, or from the basis function representations of the pupilgram data. This is done on a "data pixel by data pixel" basis, by independently calculating the distribution of diffracted light (i.e. "diffraction orders") from the specified pattern design, specifically taking into account the maximum diffraction order that is transmitted by the given lens numerical aperture. Each different "data pixel" from the pupilgram occupies a different position relative to the edge of the lens pupil, and it is this relative position to the pupil edge that defines how many orders of a given pattern will be transmitted by each of any orientation selected for analysis. The amplitude of the light in each diffraction order follows well-known mathematical functions, so once the 'maximum transmitted order' in both the positive and negative directions is determined, the total amount of optical energy (i.e. dose) can be immediately calculated. By performing this calculation multiple times, each time changing the orientation of the pattern being considered, the resulting "delta dose between pattern orientations" can be determined for each pixel in a given pupilgram data-set, or in a version of one represented by a set of basis functions.

It will be apparent to those skilled in the art that various modifications and variations can be made in the methods described, in the reticle, the wafer photographs, the software algorithms, the material chosen for the present invention, and in construction of the photolithography systems as well as other aspects of the invention without departing from the scope or spirit of the invention. While the invention has been described in terms of preferred embodiments, those skilled in the art will recognize that the invention can be practiced with modification within the spirit and scope of the appended claims.

What is claimed is:

1. A method of diagnosing a lithographic tool, comprising the steps of:
   recording at least one aerial image at a wafer plane of a lithographic tool which is an accurate reproduction of an angular light intensity distribution at a reticle plane of the lithographic tool;
   assembling the at least one aerial image into a pupilgram;
   constructing a simulated pupilgram describing a response or responses of lithographic features of interest to certain changes in the pupilgram, and identifying each response as a basis function;
   fitting the pupilgram to the constructed response or responses to determine whether a behavior associated with the pupilgram is within predetermined limits of lithographic behavior thereby determining whether the lithographic tool with the associated pupilgram will yield lithographic performance within a predefined range.

2. The method of claim 1, wherein the recording step includes the use of one of:
   (i) a pinhole reticle or source-measurement reticle with the pinhole placed above the reticle plane;
   (ii) the pinhole reticle or source-measurement reticle with the pinhole placed below the reticle plane; and
   (iii) a pinhole device at the wafer plane with a recording medium below the pinhole.

3. The method of claim 1, wherein the at least one aerial image is one aerial image and the recording step includes use of a photo-sensitive device at or below the wafer plane.

4. The method of claim 1, wherein the at least one aerial image is a series of aerial images and the recording step includes the use of a resist-coated wafer or photographic film.

5. The method of claim 1, wherein the recording step includes recording the aerial image on a resist coated wafer, wherein light is emitted at a series of exposure doses which are incrementally increased to clear resist from the wafer from a center of the projected image to edges of the projected image.

6. The method of claim 5, wherein in each exposure dose a determination is made as to what the dose was in a threshold region such that a dose-to-clear threshold in the each exposure dose represents a single contour through real intensity distribution.

7. The method of claim 1, further comprising:
   exposing the aerial image into a resist of the wafer to form several wafer patterns at different exposure doses;
   developing digitalized images of the several wafer patterns; and
   assembling contours obtained from the digitalized images of the several wafer patterns into the pupilgram.

8. The method of claim 7, further comprising:
   identifying for each of the digitalized images a grayscale or color level to identify dose-to-clear threshold area;
   identifying individual pixels of the digitalized images;
   assigning a value to each of the individual pixels that are below the dose-to-clear threshold area;
   assigning a null value to each of the individual pixels that are above the dose-to-clear threshold area; and
   assembling a set of contours from the set of the digitalized images to form a single pupilgram.

9. The method of claim 1, wherein illuminator behavior extracted from the pupilgram is performed by linear fitting to basis functions to parametrize behavior of the pupilgram.

10. The method of claim 9, wherein the basis functions account for pupilgram behaviors determined to be lithographically important.

11. The method of claim 9, wherein the basis functions are determined by one of external aerial-image and resist imaging calculation.

12. The method of claim 9, further comprising extracting sensitivity parameters from at least one constructed basis function to determine an effect on lithographic printing.

13. The method of claim 9, further comprising comparing the sensitivity parameters to the parameterized behavior of the pupilgram.

14. The method of claim 9, wherein physical parameters describing qualitative features of the basis functions are used to determine trends occurring in the pupilgram.

15. The method of claim 1, wherein the constructing step includes simulation results which allow selection of an illumination pattern and employment of user-generated files describing pupil fill.

16. The method of claim 1, further comprising placing bound on relative importance of imperfections in the pupil fill based on the analyzed constructed response and showing detracting or non-detracting performance of the lithographic tool based on imperfections in the pupil fill.

17. A method of diagnosing a lithographic tool, comprising the steps of:
   recording at least one aerial image at a wafer plane of a lithographic tool which is an accurate reproduction of an angular light intensity distribution at a reticle plane of the lithographic tool;
   assembling the at least one aerial image into a pupilgram;
   contructing at least one response of another pupilgram to at least one known illuminator behavior characteristic of the lithographic tool, and identifying each response as a basis function and fitting the pupilgram to the at least one created response to determine whether a behavior associated with the pupilgram is within predetermined limits of illuminator behavior to diagnose imperfections in the illuminator behavior.

18. The method of claim 17, wherein the recording step includes the use of one of:
   (i) a pinhole reticle or source-measurement reticle with the pinhole placed above the reticle plane;
   (iv) the pinhole reticle or source-measurement reticle with the pinhole placed below the reticle plane; and
   (v) (iii) a pinhole device at the wafer plane with a recording medium below the pinhole.

19. The method of claim 18, wherein the creating step is based on one of (i) a calculating step based on empirical data and (ii) experimentally moving an illuminator of the lithographic tool.

20. The method of claim 18, wherein the at least one aerial image is one aerial image and the recording step includes use of a photo-sensitive device at or below the wafer plane.

21. The method of claim 18, wherein the at least one aerial image is a series of aerial images and the recording step includes the use of a resist coated wafer or photographic film.

22. The method of claim 18, wherein the recording step includes recording the aerial image on a resist coated wafer, wherein light is emitted at a series of exposure doses which are incrementally increased to clear resist from the wafer from a center of the projected image to edges of the projected image.

23. The method of claim 18, wherein in each exposure dose a determination is made as to what the dose was in a threshold region such that a dose-to-clear threshold in the each exposure dose represents a single contour through real intensity distribution.

24. The method of claim 18, further comprising:
   exposing the aerial image into a resist of the wafer to form several wafer patterns at different exposure doses;
   developing digitalized images of the several wafer patterns; and
   assembling contours obtained from the digitalized images of the several wafer patterns into the pupilgram.

25. The method of claim 24, further comprising:
   identifying for each of the digitalized image a grayscale or color level to identify dose-to-clear threshold area;
   identifying individual pixels of the digitalized images;
   assigning a value to each of the individual pixels that are below the dose-to-clear threshold area;
   assigning a null value to each of the individual pixels that are above the dose-to-clear threshold area; and
   assembling a set of contours from the set of the digitalized images to form a single pupilgram.

26. The method of claim 18, wherein the illuminator behavior extracted from the pupilgram is performed by linear fitting to basis functions of the pupilgram to parameterize behavior of the illuminator of the lithographic tool.

27. The method of claim 26, wherein the basis functions account for pupilgram response to common adjustments of the illuminator.

28. The method of claim 26, wherein the basis functions are determined by comparing the pupilgram under both normal operating conditions and with predetermined misadjustments.

29. The method of claim 26, wherein physical parameters describing qualitative features of the basis functions are used to determine trends occurring in the pupilgram.

30. The method of claim 26, further comprising placing bound on relative importance of imperfections in the pupil fill based on the analyzed constructed response and showing detracting or non-detracting performance of the lithographic tool based on the imperfections in the pupil fill.

31. A method of diagnosing a lithographic tool, comprising the steps of:
   producing an aerial image or a series of aerial images at a wafer plane of a lithographic tool which are accurate reproductions of an angular light intensity distribution at a reticle plane of the lithographic tool;
   assembling the aerial image or series of aerial images into a pupilgram;
   constructing another pupilgram to at least one known illuminator behavior of the lithographic tool; and
   multiplying the pupilgram by a sensitivity function describing areas of the pupil fill having an important effect on a lithographic process under study.

32. The method of claim 31, wherein the recording step includes the use of one of:
   (i) a pinhole reticle or source-measurement reticle with the pinhole placed above the reticle plane;
   (ii) the pinhole reticle or source-measurement reticle with the pinhole placed below the reticle plane; and
   (iii) a pinhole device at the wafer plane with a recording medium below the pinhole.

33. The method of claim 31, wherein the at least one aerial image is one aerial image and the recording step includes use of a photo-sensitive device at or below the wafer plane.

34. The method of claim 31, wherein the at least one aerial image is a series of aerial images and the recording step includes the use of a resist-coated wafer or photographic film.

35. The method of claim 31, wherein the recording step includes recording the aerial image on a resist coated wafer, wherein light is emitted at a series of exposure doses which are incrementally increased to clear resist from the wafer from a center of the projected image to edges of the projected image.

36. The method of claim 35, wherein in each exposure dose it is determined what the dose was in a threshold region such that a dose-to-clear threshold in the each exposure dose represents a single contour through real intensity distribution.

37. The method of claim 31, further comprising:
   exposing the aerial image into a resist of the wafer to form several wafer patterns at different exposure doses;
   developing digitalized images of the several wafer patterns; and
   assembling contours obtained from the digitalized images of the several wafer patterns into the pupilgram.

38. The method of claim 37, further comprising:
   identifying for each of the digitalized image a grayscale or color level to identify dose-to-clear threshold area;
   identifying individual pixels of the digitalized images;
   assigning a value to each of the individual pixels that are below the dose-to-clear threshold area;
   assigning a null value to each of the individual pixels that are above the dose-to-clear threshold area; and assembling a set of contours from the set of the digitalized images to form a single pupilgram.

39. The method of claim 31, further comprising extracting a sensitivity function which determines optical dose transmitted through the lens as a function of position within illumination distribution captured by the pupilgram.

40. The method of claim 31, further comprising extracting sensitivity function which determines optical dose transmitted through the lens as a function of position within illumination distribution captured by the pupilgram, and also as a function of orientation of a specified lithographic pattern.

41. The method of claim 31, further comprising extracting a behavior from the pupilgram or from the basis functions representing illumination distribution, to determine total optical dose transmitted by the projection lens as a function of orientation of a specified pattern.

* * * * *